(12) United States Patent
Saito (10) Patent No.: US 6,968,172 B2
(45) Date of Patent: Nov. 22, 2005

(54) DC OFFSET CANCEL CIRCUIT

(75) Inventor: Shinji Saito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 470 days.

(21) Appl. No.: 10/349,106

(22) Filed: Jan. 23, 2003

(65) Prior Publication Data

US 2003/0148749 A1 Aug. 7, 2003

(30) Foreign Application Priority Data

Feb. 4, 2002 (JP) .............................. 2002-026341

(51) Int. Cl.[7] .............................. H04B 1/10; H04B 1/16
(52) U.S. Cl. .................. 455/306; 455/63.1; 455/67.13; 455/296; 455/338; 455/552.1; 327/307
(58) Field of Search ........................... 455/63.1, 67.13, 455/295, 296, 298, 299, 303, 305, 306, 311, 455/315, 324, 338, 339, 552.1, 553.1; 327/62, 327/307, 316, 560; 370/335, 337, 342, 344, 370/347

(56) References Cited

U.S. PATENT DOCUMENTS

| | | | | |
|---|---|---|---|---|
| 4,902,979 A | * | 2/1990 | Puckette, IV | ................ 455/311 |
| 5,548,244 A | * | 8/1996 | Clewer | ........................ 455/315 |
| 5,724,653 A | * | 3/1998 | Baker et al. | ................. 455/296 |
| 5,734,975 A | * | 3/1998 | Zele et al. | ................... 455/338 |
| 6,516,185 B1 | * | 2/2003 | MacNally | .................... 455/324 |
| 6,535,561 B2 | * | 3/2003 | Boesch et al. | ........... 455/553.1 |

* cited by examiner

Primary Examiner—Quochien B. Vuong
(74) Attorney, Agent, or Firm—Arent Fox PLLC (57) ABSTRACT

This invention is applied to dual mode provided receiver capable of coinciding with both TDMA system and the non-TDMA system so as to provide a DC offset cancel circuit preferable for each communication method having a compact structure. In case where a predetermined time slot is allocated as an offset quantity detection time in the TDMA system, a first feedback loop is activated and corresponding to detection signals corresponding to differential output signals OUT, XOUT by a comparator 2, a detection result is updated in the holding section 3 according to a strobe signal STB and held therein. Output signals from the holding section 3 are fed back to an amplifier 1 through a selection section 5 and a DC offset is cancelled out. In case where the offset quantity is detected successively, a second feedback loop is activated and then, detection signals from the comparator 2 are identified by a filter section 4, and fed back to the amplifier 1 through the selection portion 5, so that the DC offset is cancelled out.

15 Claims, 10 Drawing Sheets

FIRST PRINCIPLE OF THE PRESENT INVENTION

FIG. 1

FIRST PRINCIPLE OF THE PRESENT INVENTION

FIG. 2 SECOND PRINCIPLE OF THE PRESENT INVENTION

FIG. 3
CIRCUIT BLOCK DIAGRAM OF FIRST EMBODIMENT

FIG. 4   CIRCUIT BLOCK DIAGRAM OF SECOND EMBODIMENT

FIG. 5 CIRCUIT BLOCK DIAGRAM OF THIRD EMBODIMENT

FIG. 6 CIRCUIT BLOCK DIAGRAM OF FOURTH EMBODIMENT

FIG. 7  CIRCUIT BLOCK DIAGRAM OF FIFTH EMBODIMENT

FIG. 8 PRIOR ART

FIRST PRIOR ART (CORRECTION BY HIGHPASS FILTER)

FIG. 9 PRIOR ART

SECOND PRIOR ART (CORRECTION BY INTEGRATION CIRCUIT)

FIG. 10  PRIOR ART

THIRD PRIOR ART (CORRECTION BY LOWPASS FILTER)

FIG. 11  PRIOR ART

FOURTH PRIOR ART (CORRECTION BY DIGITAL ADJUSTMENT)

FIG. 12  PRIOR ART

DUAL MODE STRUCTURE

DC OFFSET CANCEL CIRCUIT

CROSS-REFERENCE TO RELATED APPLICATIONS

This application is based upon and claims the benefit of priority from each of the prior Japanese Patent Application No. 2002-26341 filed on Feb. 4, 2002, the entire contents of which are incorporated herein by reference.

BACKGROUND OF THE INVENTION

1. Field of the Invention

The present invention relates to cancellation of DC offset component that is likely to be included in an output signal, more particularly to a receiver used for mobile communication such as cellular phones.

2. Description of Related Art

Mobile communication appliances such as cellular phones rapidly prevailing in recent years need to meet demands on miniaturization, weight saving, and multi-function design. To meet such demands, in place of superheterodyne system conventionally used for a radio processing section, there has been widely employed direct conversion system that does not require an intermediate frequency signal (IF signal) and directly converts a radio frequency signal (RF) into a baseband signal. Since this system does not require a section for processing an IF signal, circuit scale of it can be compressed more than that of the superheterodyne system, which contributes to miniaturization, weight saving, and multi-function design of mobile communication appliance kind.

However, since the direct conversion system directly converts an RF signal into a baseband signal, this system cannot remove unnecessary DC offset components whereas DC offset components in an IF signal were removed by a band-pass filter or the like in the superheterodyne system. Accordingly, the direct conversion system requires a particular circuit for canceling DC offset.

Figure 8:
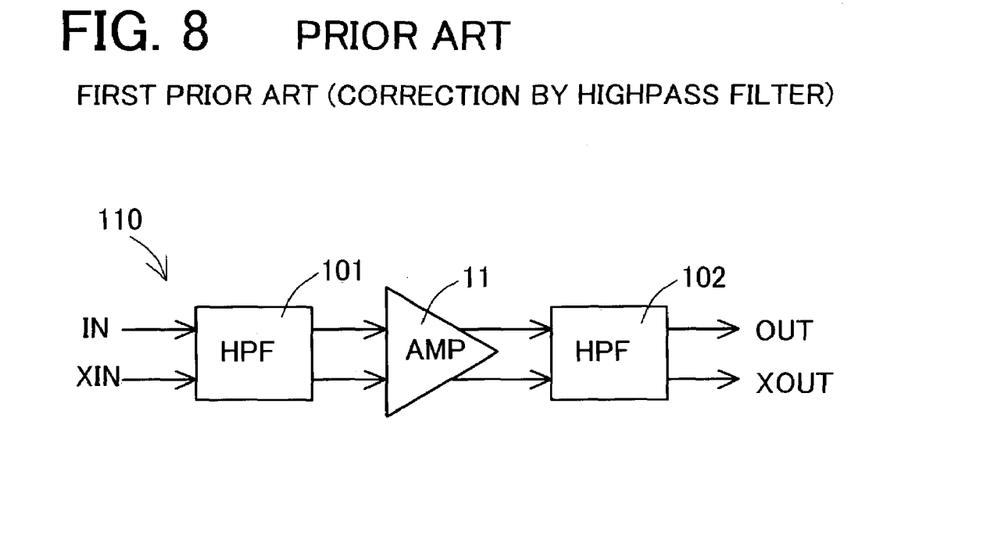
FIG. 8 is a circuit block diagram of first prior art where correction is conducted by highpass filters.
Figure 9:
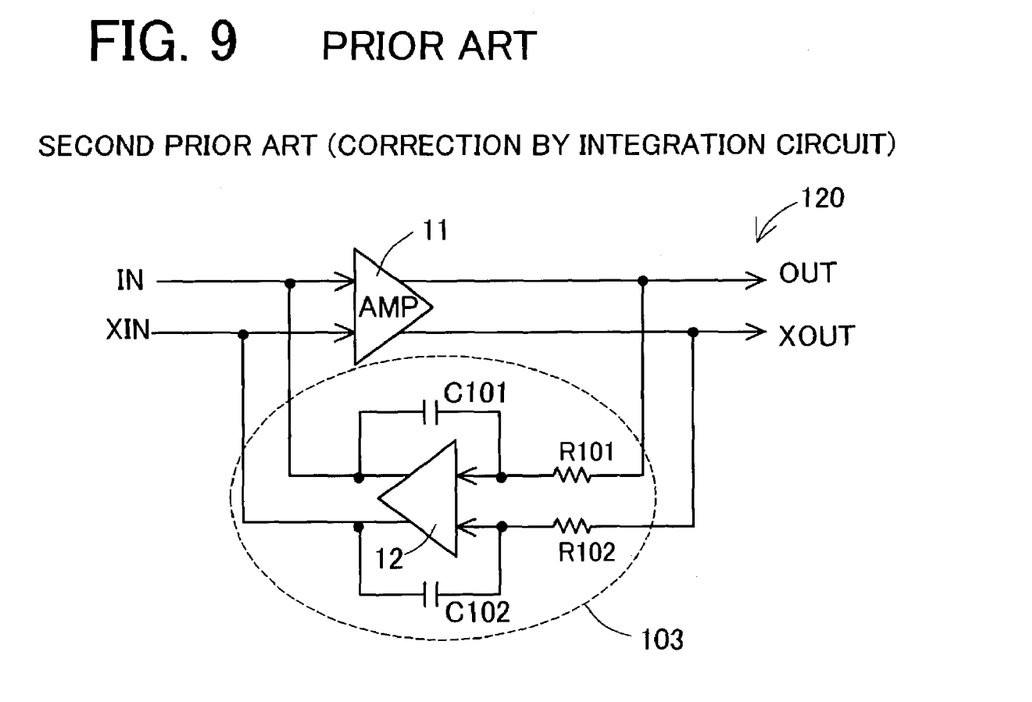
FIG. 9 is a circuit block diagram of second prior art where correction is conducted by an integration circuit.
Figure 10:
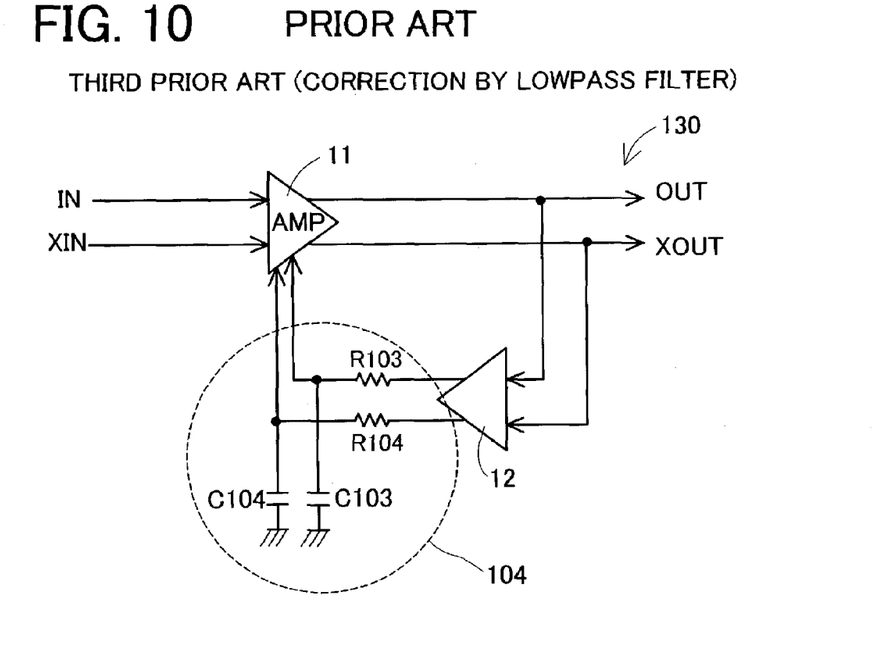
FIG. 10 is a circuit block diagram of third prior art where correction is conducted by a lowpass filter.
Figure 11:
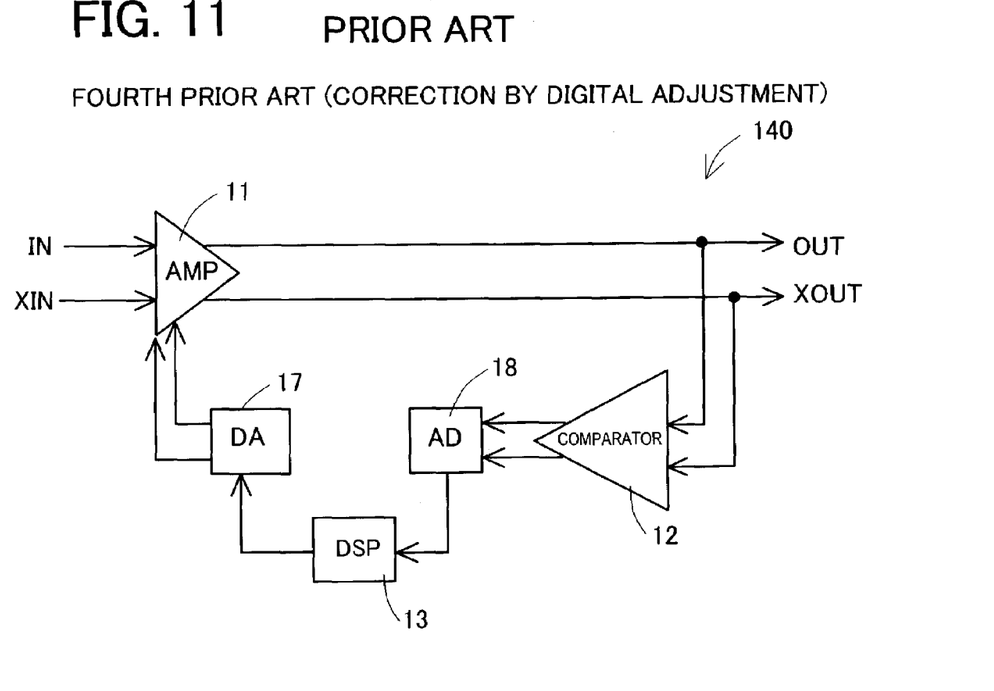
FIG. 11 is a circuit block diagram of fourth prior art where correction is conducted in a manner of digital adjustment.

FIG. 8 through FIG. 11 show examples of DC offset cancel circuits conventionally used. Out of those, examples of circuit structure shown in FIG. 8 through FIG. 10 are suitable for communication system such as called FDMA (frequency division multiple access), CDMA (code-division multiple access) or the like. FDMA and CDMA are communication system for receiving RF signals that succeed in terms of time. On the other hand, circuit structure shown in FIG. 11 is suitable for communication system such as called TDMA (time division multiple access) or the like. TDMA is communication system for receiving RF signals that do not succeed in terms of time. In the following descriptions, against TDMA system, communication system for receiving RF signals that succeed in terms of time will be mentioned as non-TDMA system.

It should be noted that FDMA (frequency division multiple access) is communication system that different frequencies are allocated to respective channels and CDMA (code-division multiple access) is communication system that different codes are allocated to respective channels. In both FDMA and CDMA, receiving signals succeed in terms of time. On the other hand, TDMA (time division multiple access) is communication system that channels are allocated to time slots each of which has its predetermined time length and RF signals circulate in each channel. Accordingly, receive operation is conducted in predetermined time slots only.

FIG. 8 shows circuit structure 110 directed to first prior art. In the circuit structure 110, there are provided highpass filters (HPF) 101, and 102 in signal paths that lead to differential output signals OUT, XOUT from differential input signals IN, XIN, respectively, through an amplifier (AMP) 11, whereby DC offset is cancelled. In FIG. 8, the highpass filters (HPF) 101, and 102 are provided at input side and output side of the amplifier (AMP) 11, respectively, whereby DC offset components are cut out in double. Other than this manner of DC offset cancellation, the first prior art can be structured with either one of the highpass filters (HPF). There are structured the highpass filters (HPF) 101, and 102 including capacitor elements in the signal paths, and, on demand, further including resistance elements between output side of the capacitor elements and reference voltage. In the circuit structure 110, DC offset is filtered in a form of analog signal and finally cancelled. Circuit structure as such is suitable for non-TDMA system where signals that succeed in terms of time are dealt.

FIG. 9 shows circuit structure 120 directed to second prior art. In the circuit structure 120, differential output signals OUT, XOUT are integrated by an integration circuit 103 and fedback to differential input signals IN, XIN, whereby DC offset is cancelled. The integration circuit 103 is constituted by a comparator 12 and a time constant circuit that is constituted by connecting two couples of a resistance element and a capacitor element (R101 and C101, R102 and C102) between differential input side and differential output side of the comparator 12. Differential output signals OUT, XOUT inputted through the resistance elements R101 and R102 include AC signal components as AC component and DC offset component as DC component. However, the integration circuit 103 integrates the differential output signals OUT, XOUT depending on time constant determined by the two couples of resistance element and capacitor element (R101 and C101, R102 and C102) and only predetermined DC offset components of those signals are feedback to an amplifier (AMP) 11. Although FIG. 9 shows structure that a feedback signal is directly fedback to differential input signals IN, XIN, it is possible to feedback a feedback signal to a point other than the input signals IN, XIN if it is a point capable of adjusting DC offset components of the amplifier (AMP) 11. For example, a feedback signal can be feedback to a bias current source to an input-stage differential pair of the amplifier (AMP) 11. Circuit structure as such is suitable for non-TDMA system where signals that succeed in term of time are dealt.

It should be noted that the comparator 12 is a circuit that has a predetermined gain and outputs a signal depending on differential signals of differential output signals OUT, XOUT.

FIG. 10 shows circuit structure 130 directed to third prior art. In the circuit structure 130, differential output signals OUT, XOUT are compared at a comparator 12 and differential output signals as comparison result are fedback to an amplifier (AMP) 11 through a lowpass filter constituted by two couples of a resistance element and a capacitor element (R103 and C103, R104 and C104), whereby DC offset is cancelled. The differential output signals OUT, XOUT and the comparison result include signal components as AC component and offset components as DC components. However, only predetermined DC offset components are extracted by the lowpass filter 104 and fedback to the amplifier (AMP) 11. Different from the case of FIG. 9, FIG. 10 is structured such that a feedback signal is feedback to an internal circuit such as bias current source to an input-stage differential pair of the amplifier (AMP) 11. The circuit structure 130 filters analog signals through the lowpass filter 104 and calculates a correction value of DC offset components. Circuit structure as such is suitable for non-TDMA system where signals that succeed in term of time are dealt.

FIG. 11 shows circuit structure 140 directed to fourth prior art. In the circuit structure 140, differential output signals OUT, XOUT are compared at a comparator 12 and then, converted into digital signals by an AD converter 18. To these digital signals, digital processing is applied by a digital signal processing circuit (DSP) so as to output correction signals against DC offset components. Since the correction signal is a digital signal, the signal is converted into an analog signal by a DA converter 17 and fedback to an amplifier (AMP) 11. In case a predetermined time slot in a predetermined communication time cycle is set as offset-quantity detecting time like TDMA system, a correction value obtained by signal processing and calculation is stored in the digital signal processing circuit (DSP) 13 or the DA converter 17, whereby DC offset is cancelled. In the circuit structure 140, an analog signal is converted into a digital signal through signal processing and a correction value and then, a correction value of DC offset component is calculated. Circuit structure as such is suitable for TDMA system where a predetermined time slot in a predetermined communication time cycle is provided as offset-quantity detecting time and a correction value of DC offset components in the next communication time cycle is determined during this predetermined time slot.

Figure 12:
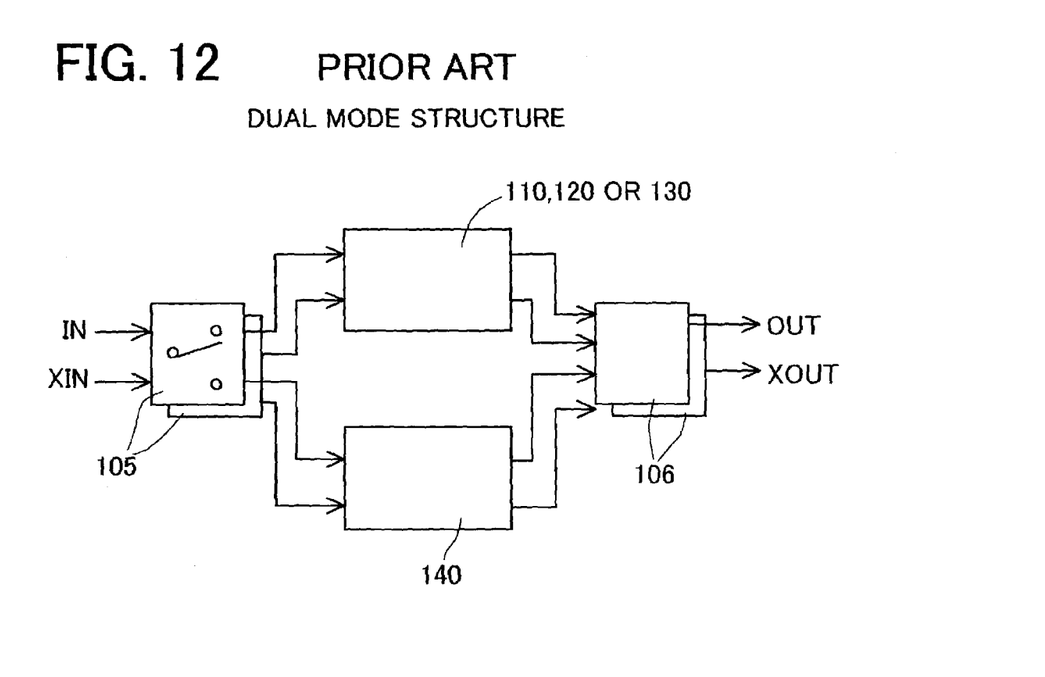
FIG. 12 is a circuit block diagram of conventional dual mode structure.

Furthermore, as communication system of mobile radio communication appliances, different communication systems actually diversify region by region: PDC, a kind of FDMA, is prevailed in Japan whereas GSM, a kind of TDMA, is prevailed in Europe. Furthermore, there has been raised and considered W-CDMA system as the next generation communication system. Therefore, there is possibility that another different communication system will coexist with the W-CDMA system while a transitional period to the next generation communication system. So, it is considered convenient that a single communication appliance is compatible with pluralities of communication system. Due to demand as such, there have been proposed dual-mode-structured receivers capable of coping with both communication system, namely, TDMA system and non-TDMA system. FIG. 12 specifically shows circuit structure capable of changing over switches of a DC offset cancel circuit. In FIG. 12, selection circuits 105 and 106 change over switches like that in case of TDMA system, the DC offset cancel circuit uses the circuit structure 140, whereas in case of non-TDMA system, the DC offset cancel circuit uses the circuit structures 110 and 120 or 130.

However, the dual-mode-structured DC offset cancel circuit having changeover-circuit structure as shown in FIG. 12 must include both the DC offset cancel circuit 140 suitable for TDMA system and the DC offset cancel circuits 110, 120, or 130 suitable for non-TDMA system. The dual-mode-structured DC offset cancel circuit further requires the selection circuits 105, 105, 106, 106 that control and select between the two types of DC offset cancel circuits and a control circuit (not shown) for outputting control signals. Inclusion of such circuits makes circuit scale large, which is problematic for mobile communication appliances such as cellular phones for which miniaturization and weight saving design are required.

Furthermore, it is conceivable to apply the circuit structure 110 through 130 suitable for non-TDMA system, directed to first through third prior art, to TDMA system. However, for securing propagation of signal components without being cut out in non-TDMA system, only DC offset components must be cut out by setting frequency band of the highpass filters 101 and 102 in the first prior art to sufficiently low frequency. Furthermore, for securing propagation of signal components, only DC offset components must be fedback as correction value in such a manner that time constant of the integration circuit 103 of the second prior art is set sufficiently large or, frequency band of the lowpass filter 104 of the third prior art is set sufficiently low. Any of these countermeasures intends to make a capacitor value of the capacitor elements C101 through C104 sufficiently large. Therefore, in case the circuit structure 110 through 130 are used for TDMA system where a predetermined time slot in a predetermined communication time cycle is allocated to each channel and a signal is received only while the predetermined time slot, rising time of a signal received during a predetermined time slot is likely to be long. Due to long rising time, there is fear that the circuit structure 110 through 130 cannot keep up with high-speed operation, which is problematic.

Vice versa, it is also conceivable to apply the circuit structure 140 suitable for TDMA system, directed to the fourth prior art, to non-TDMA system. However, in TDMA system, a predetermined time slot in a predetermined communication time cycle is allocated to each channel for receiving a signal as well as other predetermined time slot is allocated for offset quantity detection time, and operations of each channel and offset quantity detection are conducted in predetermined time slots allocated for each of them. Therefore, such communication system is hard to apply to non-TDMA system where special time for offset quantity detection cannot be secured. This is problematic.

SUMMARY OF THE INVENTION

Accordingly, the present invention is made to solve the above mentioned problems in the prior art and it is an object of the present invention is to provide a DC offset cancel circuit in a compact configuration preferable for each communication system of a dual-mode-structured receiver that is compatible with TDMA system and non-TDMA system.

To achieve the object, according to one aspect of the present invention, there is provided a DC offset cancel circuit for canceling DC offset component included in at least one output signal from a signal processing section that applies signal processing to at least one input signal, the DC offset cancel circuit comprising: a detecting section for detecting offset quantity of the DC offset component; a holding section for holding a detection result based on at least one detection signal outputted from the detector section; and a filter section for distinguishing the DC offset component, wherein either the holding section or the filter section is activated.

In the DC offset cancel circuit directed to one aspect of the present invention, when the holding section is activated, offset quantity as DC offset component included in at least one output signal from the signal processing section is detected, a detection result based on at least one detection signal is held in the holding section, and DC offset component responsive to the detection result is cancelled. When the filter section is activated, the DC offset component is distinguished and cancelled.

Thereby, in case offset is detected in such a manner that predetermined time slot in a predetermined time cycle is allocated as offset quantity detection time for detecting DC offset component, offset quantity is detected by the detecting section and a detection result based on at least one detection signal is held at the holding section, whereby DC offset component based on the detection result held at the holding section can be cancelled. In case offset is detected in such a manner that particular time for detecting offset quantity is not allocated and detection operation is conducted successively in terms of time, the filter section distinguishes DC offset component, whereby DC offset component can be cancelled.

Including the detecting section, holding section and filter section, DC offset component of at least one output signal, the inventive DC offset cancel circuit can cut out DC offset component regardless any manners of DC offset detection. Therefore, it is not necessary to provide various types of DC offset cancel circuits depending on manners of DC offset detection. Therefore, there can be realized a DC offset cancel circuit with compact structure.

It should be noted that a DC offset component means a signal component frequency band of which is lower than frequency band of effective signals including a signal outputted from the signal processing section and the DC offset component is an unnecessary signal component that does not contributed to the effective signal components.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
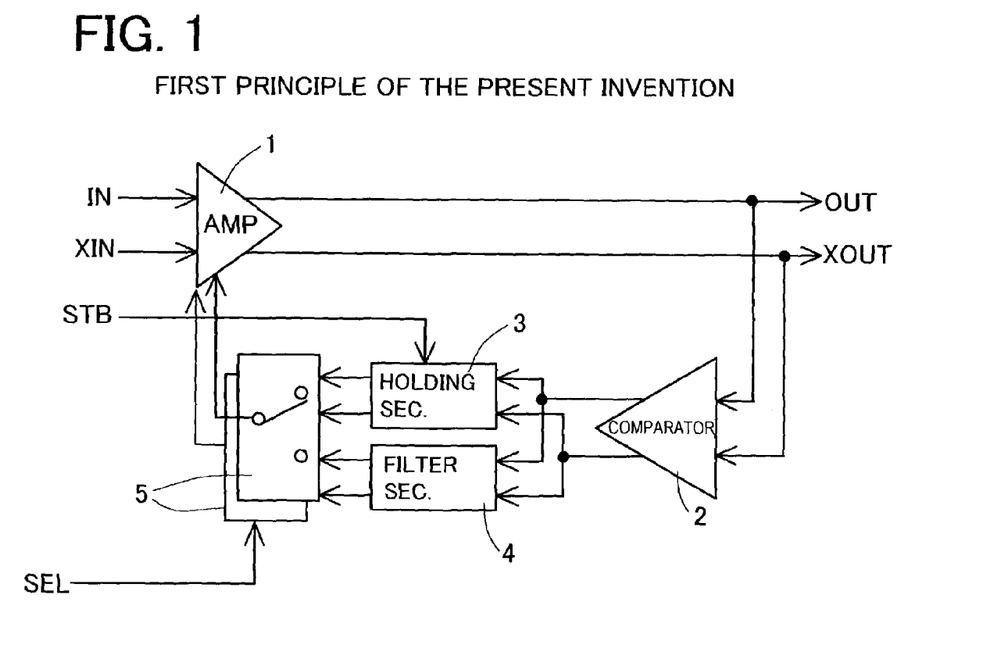
FIG. 1 a block diagram for illustrating first principle of the present invention.
Figure 2:
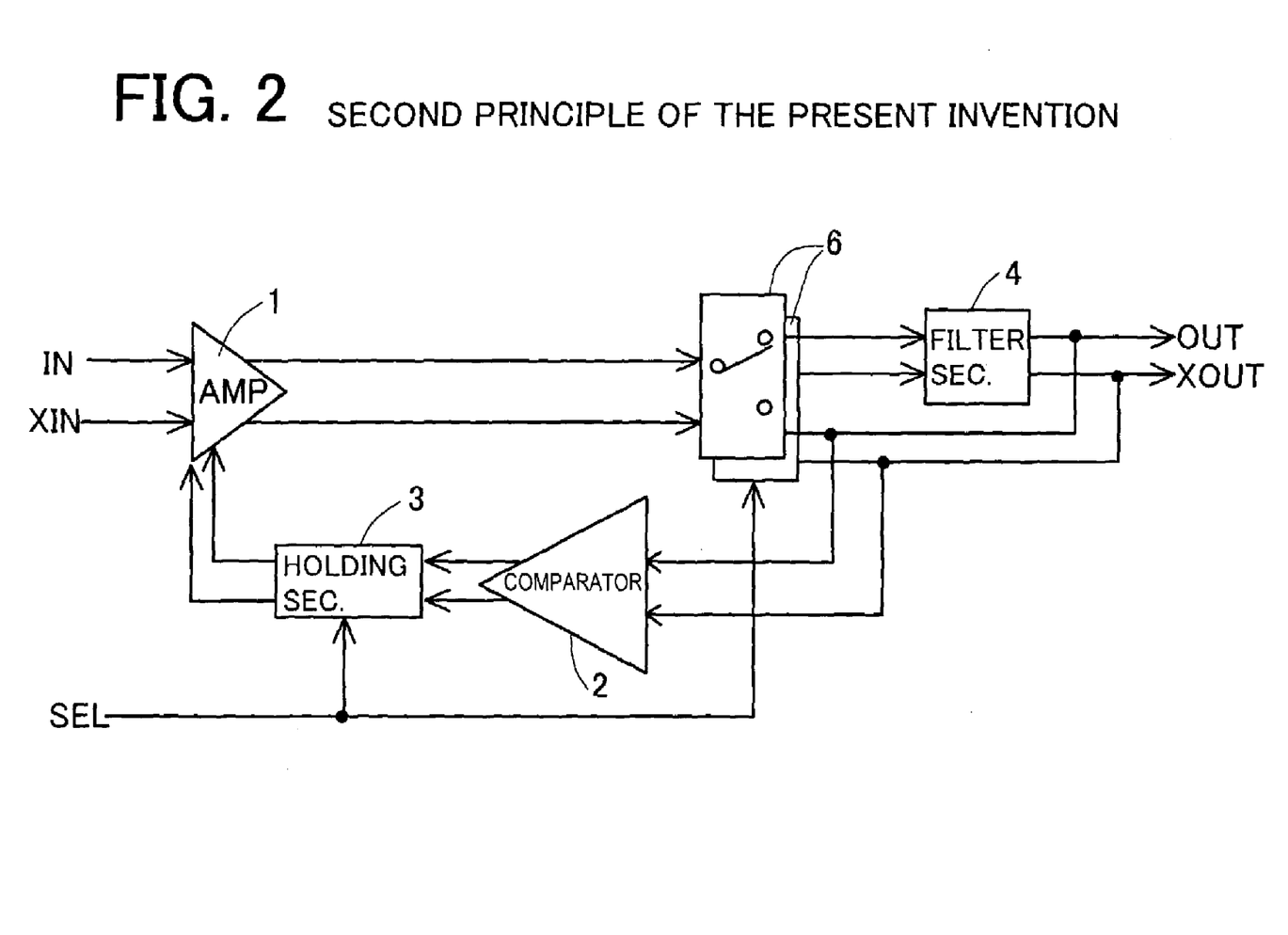
FIG. 2 is a block diagram for illustrating second principle of the present invention.

The principle of the present invention will be described with reference to FIGS. 1 and 2. The first principle explanatory diagram shown in FIG. 1 is a block diagram constituting the first principle of the invention. The second principle explanatory diagram shown in FIG. 2 is a block diagram constituting the principle of the invention.

According to the first principle explanatory diagram shown in FIG. 1, when differential output signals OUT, XOUT are outputted by amplifying differential input signals IN, XIN with an amplifier (AMP) 1 which is a signal processing portion, DC offset is cancelled out with a first or second feedback loop in order to cancel DC offset components to be mixed into the differential output signals OUT, XOUT.

If as an offset detection method, predetermined time slots in predetermined communication time cycle are allocated as offset quantity detection time of the DC offset component, a holding section 3 is selected depending on a selection signal SEL. FIG. 1 shows a construction in which the holding section 3 is selected by a selecting section 5. A comparator 2, which is a detection section, outputs detection signals corresponding to a difference of the signals between the differential output signals OUT and XOUT and a detection result corresponding to the detection signals is held by the holding section 3. Holding action for the detection result is carried out depending on a strobe signal STB, which is a trigger signal. This strobe signal STB is controlled by a control circuit (not shown) and outputted at offset quantity detection time in the predetermined time slot. The detection signals of the comparator 2 are inputted to the holding section 3 depending on the output of the strobe signal STB. In the holding section 3, a detection result held up to then is rewritten with the detection result depending on the detection signals so that they are updated. Output signals from the holding section 3 are fed back to the amplifier (AMP) 1 through a selection section 5, so that the DC offset is cancelled out. The feedback quantity is a constant feedback quantity held until it is updated every offset quantity detection time. A feedback loop formed so as to include the comparator 2 and the holding section 3 is a first feedback loop.

According to an offset detection method which carries out detection action continuously in time series without a provision of special time for detecting the offset quantity, a filter section 4 is selected depending on the selection signal SEL. Detection signals outputted from the comparator 2 are inputted to the filter section 4. The filter section 4 identifies a predetermined frequency band and feeds back to the amplifier (AMP) 1 through the selecting section 5 so as to kill the DC offset. In this case, the difference signal of the differential output signals OUT and XOUT is always detected through the comparator 2 and the filer section 4 so that feedback is applied to the amplifier (AMP) 1. The feedback loop formed so as to include the comparator 2 and the filter section 4 is a second feedback loop.

The first or second feedback loop may be formed by inputting the selection signal SEL inputted to the selecting section 5 into the holding section 3 and the filter section 4 so as to activate a selected one. In this case, the selecting section 5 is not necessary. If any one of the holding section 3 and the filter section 4 is activated to form the first or second feedback loop, the other one is kept inactive, so that the second or the first feedback loop is not formed.

According to the second principle explanatory diagram shown in FIG. 2, when differential output signals OUT, XOUT are outputted by amplifying differential input signals IN, XIN with an amplifier (AMP) 1 which is a signal processing portion, DC offset is cancelled out with a feedback loop in order to cancel DC offset components to be mixed into the differential output signals OUT, XOUT or the DC offset is removed with the filter section 4.

If as an offset detection method, a predetermined time slot in a predetermined communication time cycle is allocated as the offset quantity detection time for the DC offset component, a feedback loop is formed with the same configuration as the first principle diagram so as to kill the offset component. Because the feedback loop formed so as to include the comparator 2 and the holding section 3 is the same as in the first principle explanatory diagram so that the same operation and effect are achieved, a description thereof is omitted here. According to the second principle explanatory diagram, a selecting section 6 is provided on a path for outputting the differential output signals OUT, XOUT from the amplifier (AMP) 1 instead of the selection section 5 of the first principle explanatory diagram. Because the filter section 4 is not used when the offsets are cancelled out each other using the feedback loop, a path in which the differential output signals OUT, XOUT are outputted not through the filter section 4 by selecting the selection section 6 based on the selection signal SEL is formed.

In case of an offset detection method for carrying out the detection action continuously in time series without provision of any special time for detecting the offset quantity, the selecting section 6 is selected based on the selection signal SEL and the filter section 4 is connected to a path for outputting the differential output signals OUT, XOUT from the amplifier (AMP) 1 in order to remove an offset with the filter section 4 instead of the feedback loop. The filter section 4 identifies a predetermined frequency band, so that a signal belonging to a frequency band having a significant signal component is outputted as the differential output signals OUT, XOUT.

It is needless to say that when the filter section 4 is activated, the feedback loop including the holding section 3 needs to be made inactive.

Hereinafter, the first through the fifth embodiments of the DC offset cancel circuit of the present invention will be described in detail with reference to FIGS. 3–7. Here, the DC offset cancel circuits 10–30 indicated by the first through third embodiment are embodiments of the first principle explanatory diagram (FIG. 1) while the DC offset cancel circuits 40, 50 indicated by the fourth and fifth embodiments are embodiments of the second principle explanatory diagram.

Figure 3:
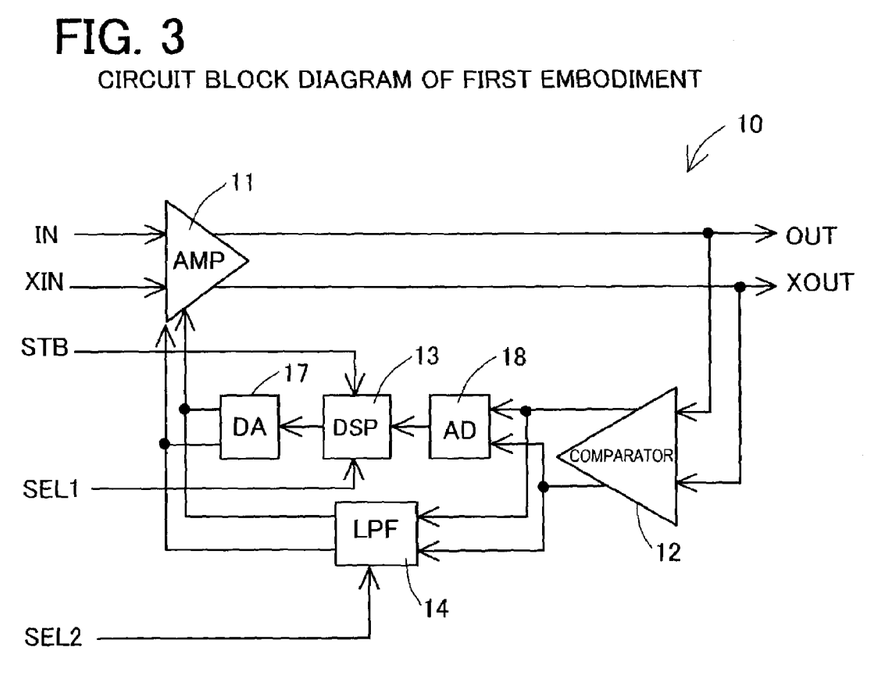
FIG. 3 is a circuit block diagram of a first embodiment.

In the DC offset cancel circuit 10 of the first embodiment shown in FIG. 3, the differential input signals IN, XIN are amplified by the amplifier (AMP) 11 so as to output the differential output signals OUT, XOUT. The differential output signals OUT, XOUT are compared by a comparator 12 so as to output differential detection signals corresponding to the difference signal. The differential detection signals outputted from the comparator 12 are inputted to an AD converter 18 and a low-pass filter (LPF) 14. The detection signals which are AD converted by the AD converter 18 are inputted to a signal processing circuit (DSP) 13 as digital signals and processed therein. After that, it is converted to analog signals by a DA converter 17. The outputs of the DA converter are connected to the outputs of the low-pass filter (LPF) 14 and fed back to the amplifier (AMP) 11. There are provided a first feedback loop comprised of the comparator 12, the AD converter 18, the signal processing circuit (DSP) 13 and the DA converter 17 and a second feedback loop comprised of the comparator 12 and the low-pass filter (LPF) 14.

Selection of the feedback loops is carried out with the selection signals SEL1, SEL2. The selection signals SEL1, SEL2 are inputted to the signal processing circuit (DSP) 13 and the low-pass filter (LPF) 14 and any one of the selection signals SEL1, SEL2 is selected so as to activate any one of the signal processing circuit (DSP) 13 and the low-pass filter (LPF) 14. At this time, a not-selected component turns to inactive condition. Because in the DC offset cancel circuit 10, the output of the DA converter 17 from the signal processing circuit (DSP) 13 is connected directly to the output of the low-pass filter (LPF) 14, the component turned to inactive condition is inhibited from executing its circuit operation and its output is maintained in a floating condition. It is permissible not to adopt this circuit system but adopt such a circuit structure for connecting both outputs selectively. Consequently, any one of the first and second feedback loops is activated. Further, a strobe signal STB is inputted as a trigger signal in the signal processing circuit (DSP) 13.

According to the TDMA system or the like for allocating a predetermined time slot as an offset quantity detection time of the DC offset component, the selection signal SEL1 is selected so that the first feedback loop is activated. The strobe signal STB is activated corresponding to the offset quantity detection time, so that the detection signals detected from the comparator 12 can be fetched in. In this fetching, the detection signals, which are analog signals, are converted to digital signals by the AD converter 18 and fetched into the signal processing circuit (DSP) 13. The fetched digital signals are subjected to digital signal processing by the signal processing circuit (DSP) 13 so that a correction value of offset corresponding to the detection signals is calculated. This correction value is held in the signal processing circuit (DSP) 13 as digital signals until a next strobe signal is activated. The correction value of the digital signals held in this way is converted to analog quantity through the DA converter 17 and fed back to the amplifier (AMP) 11.

According to the communication method based on the TDMA system or the like in which the predetermined time slot is allocated as the offset quantity detection time, it is permissible to hold the correction value corresponding to the detected offset quantity and employ as a correction value up to a next detection time.

In the non-TDMA system such as FDMA or CDMA in which no special time can be secured to calculate the correction value of offset and the offset quantity is detected successively in terms of time, the selection signal SEL2 is selected so that the second feedback loop is activated. The detection signals detected by the comparator 12 are signals outputted corresponding to the difference signal between the differential output signals OUT and XOUT, including significant signal component as well as the DC offset component. Only the DC offset component is allowed to pass by inputting these detection signals into the low-pass filter (LPF) 14 and fed back to the amplifier (AMP) 11. If the filter time constant of the low-pass filter (LPF) 14 is set to a frequency band sufficiently lower than a frequency band containing the signal component, the signals outputted from the low-pass filter (LPF) 14 can be restricted to only DC offset component and by feeding back these signals, the offset component to be mixed in the differential output signals OUT, XOUT outputted from the amplifier (AMP) 11 can be cancelled out each other.

According to the non-TDMA system in which the offset quantity is detected successively in terms of time without any special time for calculation of the correction value for the offset, only the offset quantity can be extracted from the detection signals and fed back as the correction value.

As described above, in the DC offset cancel circuit 10 of the first embodiment, if such an offset detection method in the TDMA system in which the predetermined time slot is allocated as the offset quantity detection time, the comparator 12, which is an offset quantity detection section, and a first feedback loop including the AD converter 18, the signal processing circuit (DSP) 13 and the DA converter 17, which is the holding section, are formed as the feed back loop of the amplifier (AMP) 11, which is a signal processing section. Consequently, the detection signals detected at the offset quantity detection time are converted to digital signals and processed and the processed signals are held as digital correction value of the offset quantity. Then, it is converted to analog value and fed back so as to cancel out the DC offset component.

Because the correction value of the offset component is calculated by digital signal processing, an accurate correction value with respect to detection signals corresponding to the DC offset component can be calculated quickly and securely.

In case of the offset detection method in the non-TDMA system for detecting the offset quantity succeeding in terms of time, the second feedback loop including the comparator 12 and the low-pass filter (LPF) 14 are formed as the feedback loop of the amplifier (AMP) 11. The DC offset component is identified in detection signals detected by the comparator 12 and fed back to the amplifier (AMP) 11, so that the DC offset component can be offset.

Feedback can be applied to the amplifier (AMP) 11 in order to cancel out the DC offset component by selecting and activating any one of the first feedback loop and the second feedback loop depending on the offset detection method. Two sets of different DC offset cancel circuits do not have to be provided to meet each detection method, so that the DC offset cancel circuit can be formed in a compact configuration.

The digital correction value of the DC offset component held by the signal processing circuit (DSP) 13 constituting the holding section can be updated every offset quantity detection time with the strobe signal STB, which is a trigger signal outputted depending on the offset quantity detection time.

Figure 4:
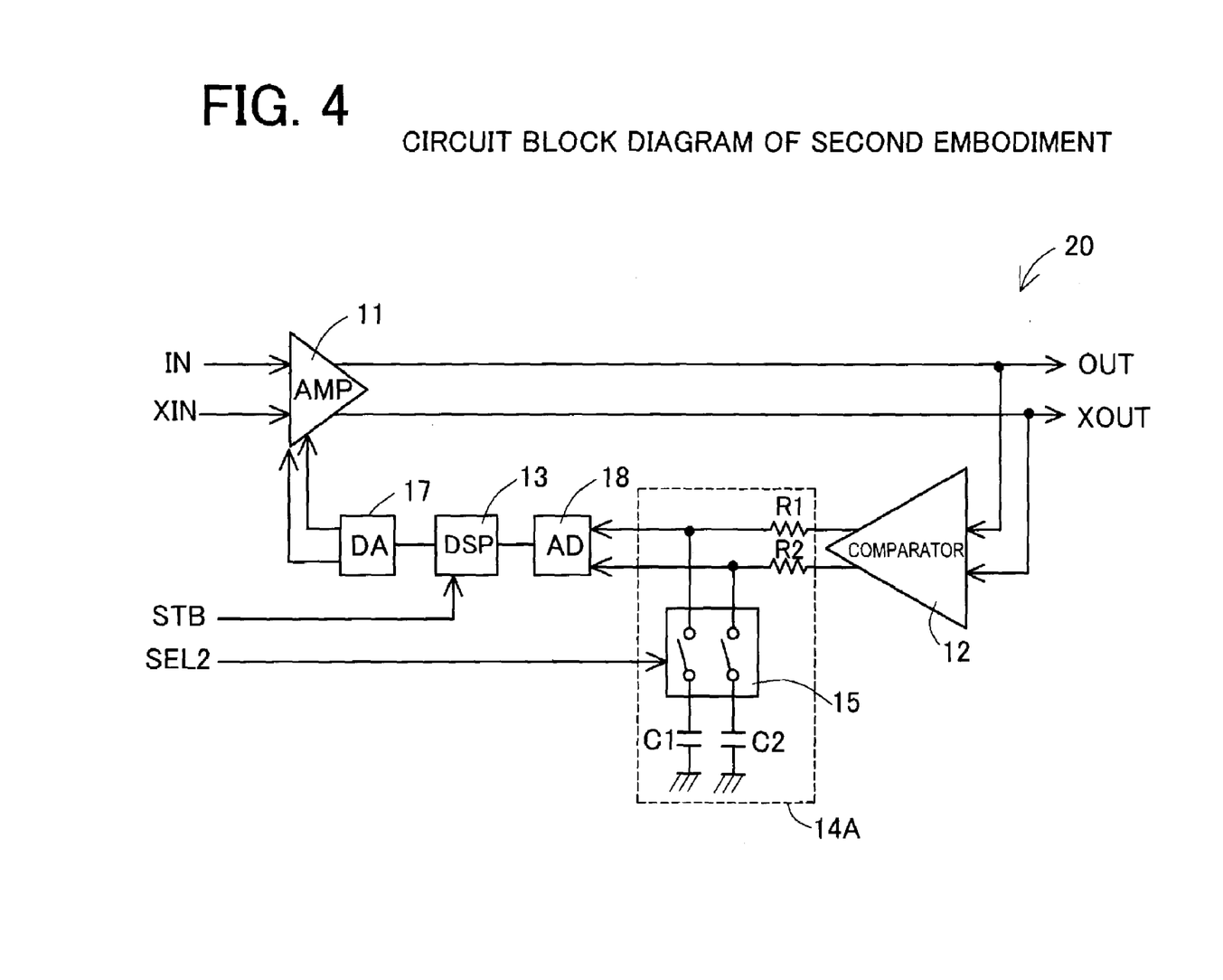
FIG. 4 is a circuit block diagram of a second embodiment.

In a DC offset cancel circuit 20 of the second embodiment shown in FIG. 4, a third feedback loop comprising the comparator 12, the low-pass filter (LPF) 14A, the AD converter 18, the signal processing circuit (DSP) 13 and the DA converter 17 provided in this order is formed instead of the first and second feedback loops in the DC offset cancel circuit 10 of the first embodiment.

The low-pass filter (LPF) 14A is comprised of capacitor elements C1, C2 and resistance elements R1, R2 and provided with a first change-over switch section 15 between signal path and the capacitor elements C1, C2 and it is controlled based on the selection signal SEL2. If offset by the low-pass filter (LPF) 14A is desired to be cancelled out by activating the control signal SEL 2, the capacitance devices C1, C2 are connected to the signal path, so that the low-pass filter (LPF) 14A exerts the filter function for a predetermined frequency band. The low-pass filter (LPF) 14A extracts DC offset component from detection signals containing a significant signal component and DC offset component. The extracted offset component is converted to digital signals and processed, and the processed signals are held by the signal processing circuit (DSP) 13 as a digital correction value. This digital feedback value is converted to analog value and fed back to the amplifier (AMP) 11. This feedback action is successive in terms of time, so that it can be adapted to the non-TDMA system.

On the other hand, if the selection signal SEL2 is made inactive, the capacitance devices C1, C2 are separated from the low-pass filter (LPF) 14A, so that its filter function is halted. The configuration of the feedback loop at this time is the same as that of the first feedback loop in the DC offset cancel circuit 10 of the first embodiment and can be adapted to the TDMA system. The selection signal SEL1 is not used here and it is so constructed that when the selection signal SEL1 is active, the selection signal SEL2 is inactive.

Although about the DC offset cancel circuit 20, an example in which the capacitor elements C1, C2 are connected/disconnected through the low-pass filter (LPF) 14A has been described, it is permissible to adopt such a structure capable of changing the filter time constant as well as disconnect the capacitor elements C1, C2 completely. Alternatively, it is also permissible to reduce the characteristic value by switching over the capacitance device or the resistance device or both of them.

Figure 5:
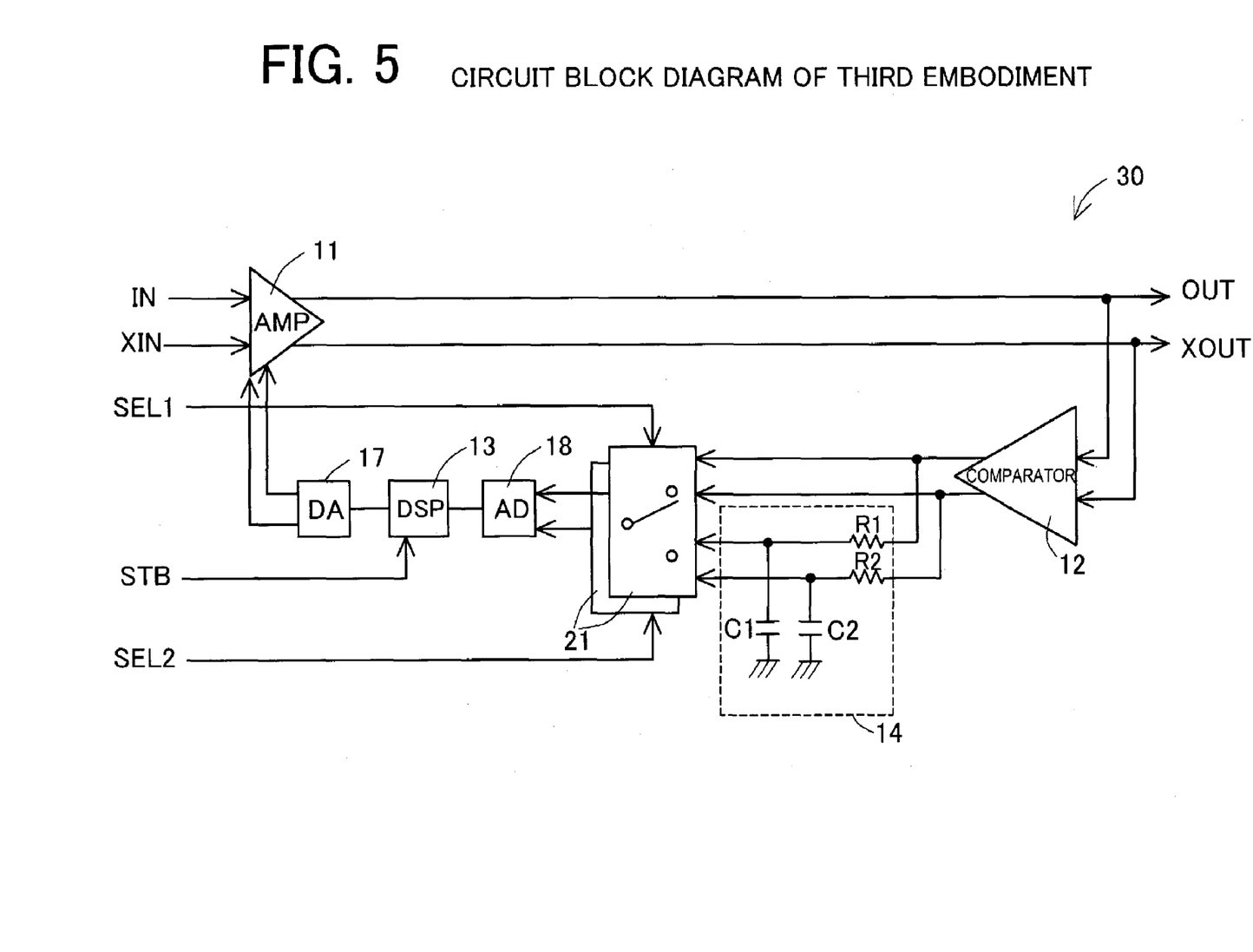
FIG. 5 is a circuit block diagram of a third embodiment.

The DC offset cancel circuit 30 of the third embodiment shown in FIG. 5 comprises a feedback signal path which passes through the low-pass filter (LPF) 14 and a feedback signal path which bypasses the low-pass filter (LPF) 14 instead of the lowpass filter (LPF) 14A in the DC offset cancel circuit 20 of the second embodiment and any one feedback signal path is selected by a feedback signal selection section 21. The feedback-signal-path selection section 21 is controlled based on the selection signals SEL1, SEL2.

When the control signal SEL1 is activated, the feedback signal path which bypasses the low-pass filter (LPF) 14 is selected. When the control signal SEL2 is activated, the feedback signal path which passes through the low-pass filter (LPF) 14 is selected. Feedback signal paths selected by the control signals SEL1, SEL2 are inputted to the AD converter 18. The presence or absence of the low-pass filter (LPF) 14 can be switched based on the control signals SEL1, SEL2. The DC offset cancel circuit 30 of the third embodiment has the same circuit configuration as the DC offset cancel circuit 20 of the second embodiment except that the setting of the low-pass filter (LPF) 14 is different, so that the same operation and effect are exerted.

As described above, in the DC offset cancel circuit 20 of the second embodiment, according to the offset detection method in the non-TDMA system for detecting the offset quantity succeeding in terms of time, the low-pass filter (LPF) 14A, which is a filter portion formed by connecting the capacitance devices C1, C2 with the first change-over switch section 15 which is a first selection portion, is set up to identify a predetermined frequency band. Consequently, the third feedback loop is capable of holding signals identified with the low-pass filter (LPF) 14A with the signal processing circuit (DSP) 13 and feeding back. The DC offset component can be cancelled out corresponding to the DC component belonging to a band lower than the predetermined frequency band identified by the low-pass filter (LPF) 14A.

According to the offset detection method in the TDMA system in which a predetermined time slot is allocated as the offset quantity detection time, the capacitor elements C1, C2 are separated by the first change-over switch section 15 so as to exclude the filter function of the low-pass filter (LPF) 14A. Consequently, the third feedback loop is capable of feeding back a detection result corresponding to detection signals from the comparator 12, which is a detection section and offsetting the DC offset component corresponding to the detection result of the comparator 12.

In the DC offset cancel circuit 30 of the third embodiment, according to the offset detection method in the non-TDMA method for detecting the offset quantity succeeding in terms of time, the feedback signal selection path which passes through the low-pass filter (LPF) 14 which is a filter section is selected by the feedback-signal-path selection section 21. Consequently, the third feedback loop is capable of holding signals identified by the low-pass filter (LPF) 14 with the signal processing circuit (DSP) 13 and feeding back. This DC offset cancel circuit is capable of canceling out the DC offset component corresponding to a DC component belonging to a band lower than the predetermined frequency band identified by the low-pass filter (LPF) 14.

According to the offset detection method in the TDMA system in which the predetermined time slot is allocated as the offset quantity detection time, the feedback signal path which bypasses the low-pass filter (LPF) 14 is selected by the feedback-signal-path selection section 21. Consequently, the third feedback loop is capable of feeding back the detection result corresponding to detection signals from the comparator 12, which is a detection section and canceling out the DC offset component corresponding to the detection result of the comparator 12.

Because the presence or absence of the filter function in the low-pass filter (LPF) 14A or 14 can be switched corresponding to the offset detection method, the DC offset component which should be fed back to the amplifier (AMP) 11, which is a signal processing section, can be switched. Thus, two sets of different DC offset cancel circuits do not have to be provided corresponding to each detection method, so that the DC offset cancel circuit can be formed in a compact configuration.

In the DC offset cancel circuits 20, 30 of the second and third embodiments, same reference numerals are attached to the same components between embodiments and the same operation and effect are exerted. Thus, a description thereof is omitted.

The DC offset cancel circuits 10-30 of the first through third embodiments are capable of obtaining the same operation and effect with an integration circuit instead of the low-pass filters (LPF) 14, 14A.

Figure 6:
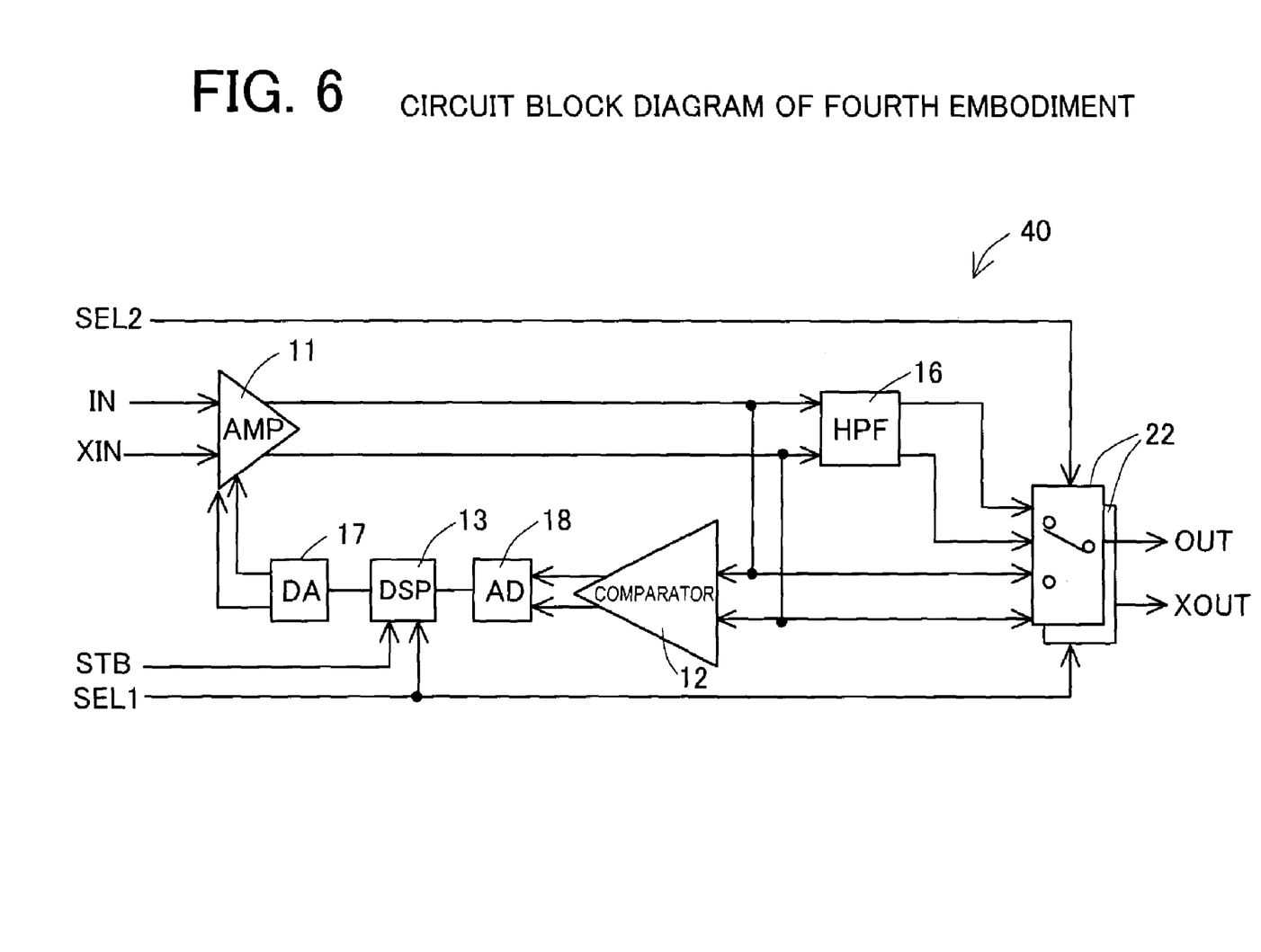
FIG. 6 is a circuit block diagram of a fourth embodiment.

In the DC offset cancel circuit 40 of the fourth embodiment shown in FIG. 6, the differential input signals IN, XIN are amplified by the amplifier (AMP) 11 and any one of the path which passes through the highpass filter (HPF) 16 and the path which bypasses it is selected by the output-signal-path selection section 22. Such a structure in which the differential output signals of the amplifier (AMP) 11 are fed back through a feedback loop comprising the comparator 12, the AD converter 18, the signal processing circuit (DSP) 13 and the DA converter 17 is the same as the first feedback loop in the DC offset cancel circuit 10 of the first embodiment.

The selection of the output signal path by the output-signal-path selection section 22 is carried out by selecting any one of the selection signals SEL1, SEL2. A component which is not selected at this time turns to inactive condition. More specifically, if the selection signal SEL1 is activated and the output signal path which bypasses the highpass filter (HPF) 16 is selected, the output signal path is interrupted so that the highpass filter 16 turns to inactive condition. If the selection signal SEL2 is activated and the output signal path which passes through the highpass filter (HPF) 16 is selected, no correction value is maintained in the signal processing circuit (DSP) 13. Consequently, the feedback quantity becomes zero, so that the same condition as when the feedback loop is made inactive occurs. According to other circuit configuration, it is permissible to provide a signal path selection section between the signal path to the comparator 12 and the signal path to the highpass filter (HPF) 16 so as to activate any one of them while making the other one inactive.

According to the TDMA system or the like in which the predetermined time slot is allocated as the offset quantity detection time, the selection signal SEL1 is selected and the feedback loop is activated. Digital signal processing is carried out by the signal processing circuit (DSP) 13 with the strobe signal STB which is activated corresponding to the offset quantity detection time so that the offset correction value corresponding to the detection signals is updated. This digital correction value is converted to analog quantity through the DA converter 17 and fed back to the amplifier (AMP) 11. At this time, the output signal path which bypasses the highpass filter (HPF) 16 is selected so as to output the differential output signals OUT, XOUT.

According to the non-TDMA system such as FDMA, CDMA in which the offset quantity is detected successively in terms of time while it is incapable of securing any special time for detecting the offset quantity, the selection signal SEL2 is selected and as the differential output signal of the amplifier (AMP) 11, the differential output signals OUT, XOUT are outputted by the output signal path through the highpass filter (HPF) 16. The DC offset component is removed from the differential output signals of the amplifier (AMP) 11 by the highpass filter (HPF) 16 so as to output a significant signal component.

In the DC offset cancel circuit 40 of the fourth embodiment, same reference numerals are attached to the same components between embodiments and the same operation and effect are exerted. Thus, a description thereof is omitted.

Figure 7:
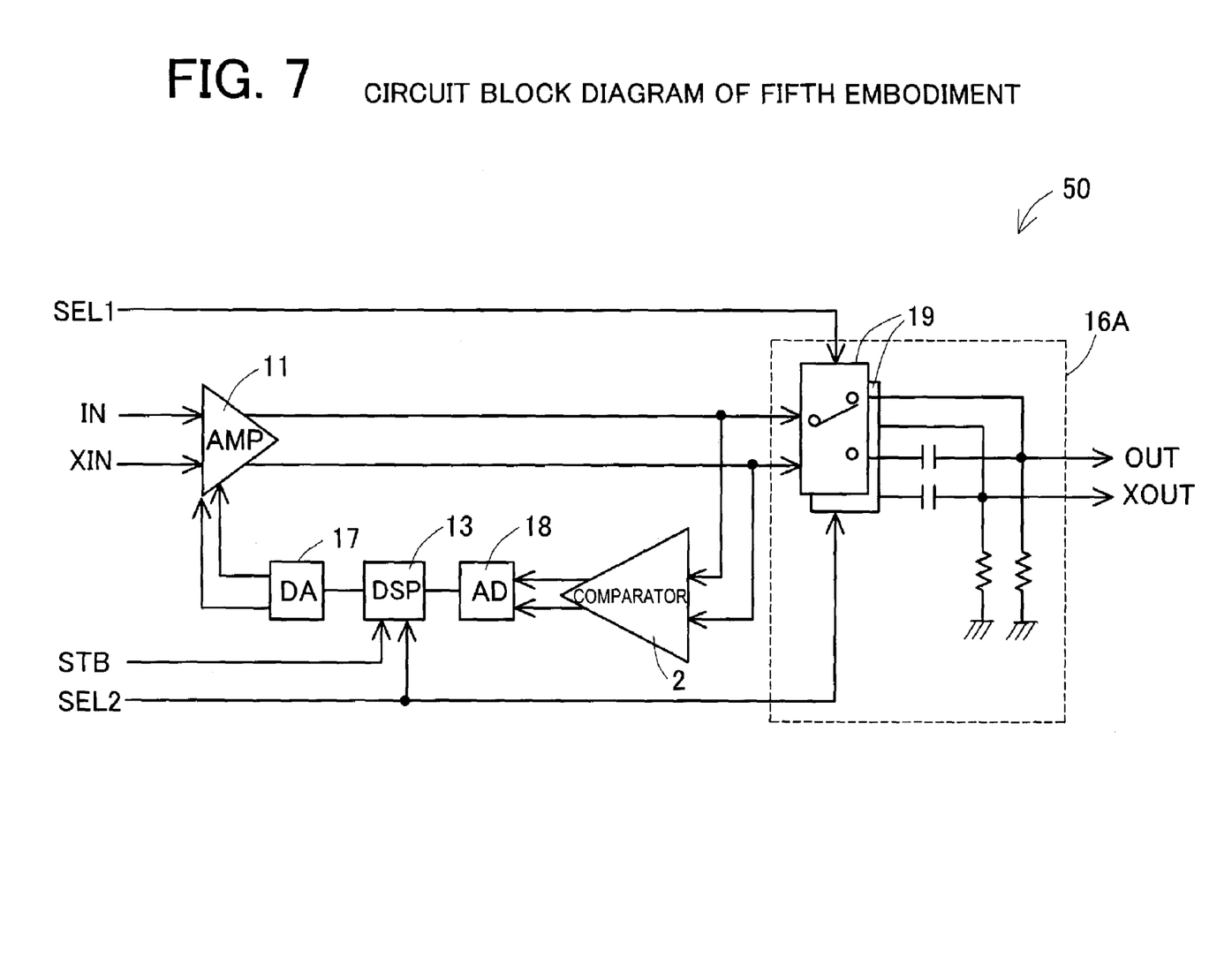
FIG. 7 is a circuit block diagram of a fifth embodiment.

The DC offset cancel circuit 50 of the fifth embodiment shown in FIG. 7 is provided with a second change-over switch section 19 instead of an output-signal-path selection section 22 in the DC offset cancel circuit 40 of the fourth embodiment and the second output signal path, the second change-over switch section 19 selecting the presence or absence of a capacitor element connected to the output signal path for the differential output signals OUT, XOUT and selecting the filter function of the highpass filter (HPF) 16A.

If the selection signal SEL1 is activated, the capacitor elements are inhibited from being attached to the output signal path and the filter function by the highpass filter (HF) 16A is halted. The structure at this time is the same as the structure for balancing an offset by the feedback loop in the DC offset cancel circuit 40 of the fourth embodiment and can be applied to the TDMA system.

If the selection signal SEL2 is activated, the capacitor elements are connected to the output signal path so that the highpass filter (HPF) 16A exerts the filter function in the predetermined frequency band. The structure at this time is the same as the structure for removing an offset by the highpass filter (HPF) 16 in the DC offset cancel circuit 40 of the fourth embodiment and can be applied to the non-TDMA system.

Although about the DC offset cancel circuit 50, an example in which the capacitance device which constitutes the highpass filter (HPF) 16A is connected/disconnected has been described, it is permissible to adopt such a structure capable of changing the filter time constant as well as disconnect the capacitor element completely. Alternatively, it is also permissible to reduce the characteristic value of the capacitor element.

In the DC offset cancel circuit 50 of the fifth embodiment, same reference numerals are attached to the same components between embodiments and the same operation and effect are exerted. Thus, a description thereof is omitted.

As described above, in the DC offset cancel circuit 40 or 50 of the fourth or fifth embodiment, according to the offset detection method for detecting offset quantity succeeding in terms of time, the second path from the output-signal-path selection section 22 which is a second selection section up to the differential output signals OUT, XOUT through the highpass filter (HPF) 16 which is a filter section, is selected or the filter function of the highpass filter (HPF) 16A is validated by the second change-over switch section 19. Consequently, the DC offset component to be mixed into the differential output signals from the amplifier (AMP) 11 is always identified, so that the DC offset component can be removed from the differential output signals OUT, XOUT.

In this case, by adopting a structure in which no correction value is held in the signal processing circuit (DSP) 13 constituting the holding section when removing the DC offset component with the highpass filters (HPF) 16, 16A, the feedback quantity can be reduced to zero. Consequently, deflection of the DC offset component by the feedback can be suppressed without providing a releasing means for the feedback loop such as a change-over switch section.

According to the offset detection method in which a predetermined time slot is allocated as the offset quantity detection time, the second bypass path which bypasses the highpass filter (HPF) 16 is selected by the output-signal-path selection section 22 or the filter function of the highpass filter (HPF) 16A is stopped by the second change-over switch section 19. Consequently, a detection result from the comparator 12 which is a detection section corresponding to a detection signals can be fed back, so that the DC offset component can be cancelled out corresponding to the detection result of the comparator 12.

Canceling out of the offset component by the feedback loop formed including the comparator 12 the signal processing circuit (DSP) 13 constituting and the holding section or removing of the offset component by the highpass filters (HPF) 16, 16A can be activated selectively depending on the offset detection method. Thus, two sets of different DC offset cancel circuits do not have to be provided depending on each detection method, and therefore, the DC offset cancel circuit can be formed in a compact configuration.

In the DC offset cancel circuit 50 of the fifth embodiment, according to the offset detection method for detecting the offset quantity succeeding in terms of time, the feedback loop which is a feedback loop to the amplifier (AMP) 11 is made inactive and at the same time, the highpass filter (HPF) 16A is set up to identify a predetermined frequency band with the second change-over switch section 19 which is a second switching section. Consequently, the DC offset component to be mixed into the output signals can be always identified so as to remove the DC offset component. According to the offset detection method in which a predetermined time slot is allocated as the offset quantity detection time, the filter function of the highpass filter (HPF) 16A is excluded by the second changeover switch section 19 and at the same time, the feedback loop is formed as the feedback loop to the amplifier (AMP) 11. Consequently, by feeding back a detection result detected in the offset quantity detecting time and held in the holding section, the DC offset component can be cancelled out. As a result, the DC offset cancel circuit can be formed in a compact configuration.

In the meantime, the present invention is not restricted to the above-described embodiments and needless to say, the present invention may be modified in various ways within a scope not departing from the gist of the present invention.

Although in this embodiment, an example of canceling out or removing the DC offset component to be mixed into the output signals from the amplifier (AMP) 11 has been described, the present invention is not restricted to this example, but the invention can be applied to other signal processing circuit than the amplifier, such as an active filter.

If the present invention is applied to a dual mode provided receiver capable of coinciding with any communication system, the TDMA system in which a predetermined time slot within a predetermined communication time cycle is allocated as the offset quantity detection time of the DC offset component or the non-TDMA system provided with no special time for detecting the offset quantity and capable of executing offset detecting action continuously in terms of time, the DC offset cancel circuit preferable for each communication system can be formed in a compact configuration.

What is claimed is:

1. A DC offset cancel circuit for canceling DC offset component included in at least one output signal from a signal processing section that applies signal processing to at least one input signal, the DC offset cancel circuit comprising:
    a detecting section for detecting offset quantity of the DC offset component;
    a holding section for holding a detection result based on at least one detection signal outputted from the detector section; and
    a filter section for distinguishing the DC offset component,
    wherein either the holding section or the filter section is activated.

2. A DC offset cancel circuit according to claim 1 further comprising:
    a first feedback loop that encompasses the detector section and the holding section and returns to the signal processing section; and
    a second feedback loop that encompasses the detecting section and the filter section and returns to the signal processing section,
    wherein the detection signal is inputted to the filter section and either the first feedback loop or the second feedback loop is activated.

3. A DC offset cancel circuit according to claim 2, wherein the filter section includes a lowpass filter or an integration circuit.

4. A DC offset cancel circuit according to claim 1 further comprising:
    a first switching section for switching frequency band of the filter section; and
    a third feedback loop that encompasses the detecting section, the filter section and the holding section in this order and returns to the signal processing section,
    wherein the detection signal is inputted to the filter section.

5. A DC offset cancel circuit according to claim 1 further comprising:
    a first bypass path for bypassing the filter section;
    a first selecting section for selecting either a first path that goes through the filter section or the first bypass path; and
    a fourth feedback loop that encompasses the detecting section, their first path or the first bypass path, and the holding section in this order and returns to the signal processing section,
    wherein the detection signal is inputted to the filter section.

6. A DC offset cancel circuit according to claim 1 further comprising a feedback loop that encompasses the detecting section and the holding section and returns to the signal processing section, wherein the output signal is inputted to the filter section.

7. A DC offset cancel circuit according to claim 6 further comprising a second switching section for switching frequency band of the filter section.

8. A DC offset cancel circuit according to claim 6 further comprising:

a second bypass path for bypassing the filter section;

a second selecting section for selecting either a second path that goes through the filter section or the second bypass path.

9. A DC offset cancel circuit according to claim 6, wherein the filter section includes a highpass filter.

10. A DC offset cancel circuit according to claim 1, wherein the holding section holds a correction value of the DC offset component obtained through signal processing in accordance with the detection signal as the detection result.

11. A DC offset cancel circuit according to claim 10, wherein the signal processing is equivalent to digital signal processing and the correction value is a digitalized value.

12. A DC offset cancel circuit according to claim 10, wherein the correction value is renewed by a trigger signal.

13. A DC offset cancel circuit according to claim 10, wherein, in case the holding section is in a non-active state, the holding section does not hold the correction value.

14. A DC offset cancel circuit according to claim 1, wherein the signal processing section includes an amplifier.

15. A DC offset cancel circuit according to claim 1, wherein the signal processing section includes an active filter.

* * * * *